US005523524A

United States Patent [19]

Prokisch et al.

[11] Patent Number: 5,523,524

[45] Date of Patent: Jun. 4, 1996

[54] DOUBLE CHAMBER BASS REFLEX BOX

[75] Inventors: Jörg Prokisch, Schwarzach; Markus Woldrich, Prien, both of Germany

[73] Assignee: Nokia Technology GmbH, Pforzheim, Germany

[21] Appl. No.: 353,892

[22] Filed: Dec. 12, 1994

[30] Foreign Application Priority Data

Dec. 24, 1993 [DE] Germany .......................... 43 44 618.3

[51] Int. Cl.[6] ........................................ H05K 5/00

[52] U.S. Cl. ........................................ 181/156; 181/199

[58] Field of Search .................................... 181/145, 148, 181/154, 156, 199; 381/86, 188, 205

[56] References Cited

U.S. PATENT DOCUMENTS

| | | | |
|---|---|---|---|
| 4,905,860 | 3/1990 | Kurihara et al. | 381/86 X |
| 5,033,577 | 7/1991 | Veranth | 181/156 X |
| 5,092,424 | 3/1992 | Schreiber et al. . | |
| 5,147,986 | 9/1992 | Cockrum et al. . | |

FOREIGN PATENT DOCUMENTS

| | | |
|---|---|---|
| 3590179 | 3/1985 | Germany . |
| 8901575 | 7/1989 | Germany . |
| 3902437 | 8/1990 | Germany . |
| 9100354 | 5/1991 | Germany . |
| 4121408 | 1/1993 | Germany . |
| 8505004 | 11/1985 | WIPO . |

*Primary Examiner*—Khanh Dang

*Attorney, Agent, or Firm*—Ware, Fressola, Van Der Sluys & Adolphson

[57] ABSTRACT

According to the state of the art, double chamber bass reflex boxes are constructed so that the housing is separated by a partition wall into two spaces (13, 14). A loudspeaker (19) is inserted into the partition wall. One of the two spaces (13, 14) is equipped with an outlet opening, into which a so-called bass reflex tube is inserted for tuning the box. If complicated housing shapes are to be manufactured, it is not possible to build the bass reflex tube and the wall to which it is connected, in one piece. In such instances it is rather necessary to insert the so-called bass reflex tube into an opening in the wall, and to attach it by means of suitable sealing and connecting means. For that reason the invention has the task of presenting a housing for double chamber bass reflex boxes (10) which is especially easy to produce. This task is fulfilled in that the closed volume (13) of the box (10) is formed by a blow-molded hollow body (11), that the tuning space (14) of box (10) is also formed by a blow-molded hollow body (12), that a wall of each of the two hollow bodies (11, 12) contains a cavity (16) which extends to the inside of the hollow body (11, 12), and that the open volume (26) of box (10) is created by connecting the two hollow bodies (11, 12), when the walls (15) equipped with the cavities (16) are joined together. A particularly good space utilization is provided when the openings (22) and the outlet opening (24) are arranged symmetrical to each other.

5 Claims, 3 Drawing Sheets

DOUBLE CHAMBER BASS REFLEX BOX

TECHNICAL FIELD

The invention concerns the construction of double chamber bass reflex boxes, particularly with the formation of very simple-to-build housings to construct such boxes.

BACKGROUND OF THE INVENTION

Subwoofer boxes, which operate according to the double chamber principle, are generally known in the state of the art, so that a detailed explanation of the operation of such boxes can be omitted.

As explained in detail by DE 41 21 408, double chamber boxes are formed by dividing the outer housing into two spaces by means of a partition wall. Depending on the construction, each opening in the partition wall contains either one or a number of loudspeakers. The sound of the respective loudspeaker radiates through the so-called open volume of the box, which is equipped with a radiation opening for that purpose, and which connects the open volume with the listening space. The other space formed by the partition wall, which is also called a closed volume, is fully separated from the listening space by the loudspeaker, the partition wall and the housing.

To tune such boxes, a so-called bass reflex tube is usually inserted and connected to the radiation opening. If the double chamber box being built has a simple geometric form, it is possible to construct the bass reflex tube and the wall, into which the tube is inserted, in one piece—perhaps by using the injection molding method. However, if double chamber boxes have complicated geometric forms, in accordance with the requirements of many users of such boxes, in most cases it is not possible to form the bass reflex tube and the wall, into which it is inserted, in one piece. In such cases it is necessary to form the bass reflex tube as a separate part, and then attach it to the open volume of the box. This connection of open space and bass reflex tube is not uncritical, since on the one hand a strong connection between tube and wall is required, and on the other the tube must be air-tight against the wall. Due to the production tolerances between the opening in the wall and the outside diameter of the bass reflex tube, it is necessary to take expensive connecting and sealing measures in such cases. Furthermore, the accuracy of the depth of penetration of the bass reflex tube into the open volume must be ensured during installation.

For that reason the invention has the task of presenting a double chamber box that can be produced without great expense, even if the double chamber box has complicated shapes.

SUMMARY OF THE INVENTION

According to the invention, the housing of a double chamber box is formed of two hollow bodies, which are easy to produce by the blow-molding method, even if the box has complicated shapes. Each of these two hollow bodies encloses a space, and has cavities in the walls that face each other in the assembled condition. If the two hollow bodies are connected to each other by the walls that contain the cavities, these cavities enclose a space which can be used as a closed or open space of the box, depending on the structure of the hollow bodies. The reason that the space formed between the two cavities is only used as an open volume of the box in connection with this application, is based on the fact that it is especially easy to construct. If the formed space were used as a closed volume of the box, the hollow bodies in the walls, with which they will be connected, would have to have corresponding openings through which the sound waves, radiated by the loudspeaker inside the box, can be transferred from the one hollow body to the tuning space of the other hollow body.

The space enclosed by one of the two hollow bodies can be used as a so-called tuning space. Tuning space means the space that is used to tune the box, which is realized by the so-called bass reflex tube in state-of-the-art boxes. Since the tuning space is produced at the same time as the respective hollow body, no special measures are required to connect the tuning space to the open volume of the box.

A particularly good utilization of the box volume (with reference to the gross volume of the box) is provided if the sound outlet opening, which connects the tuning space with the listening space, is placed symmetrical to the openings that connect the open volume with the tuning space.

BEST MODE FOR CARRYING OUT THE INVENTION

The invention will now be explained in more detail by means of the figures.

Figure 1:
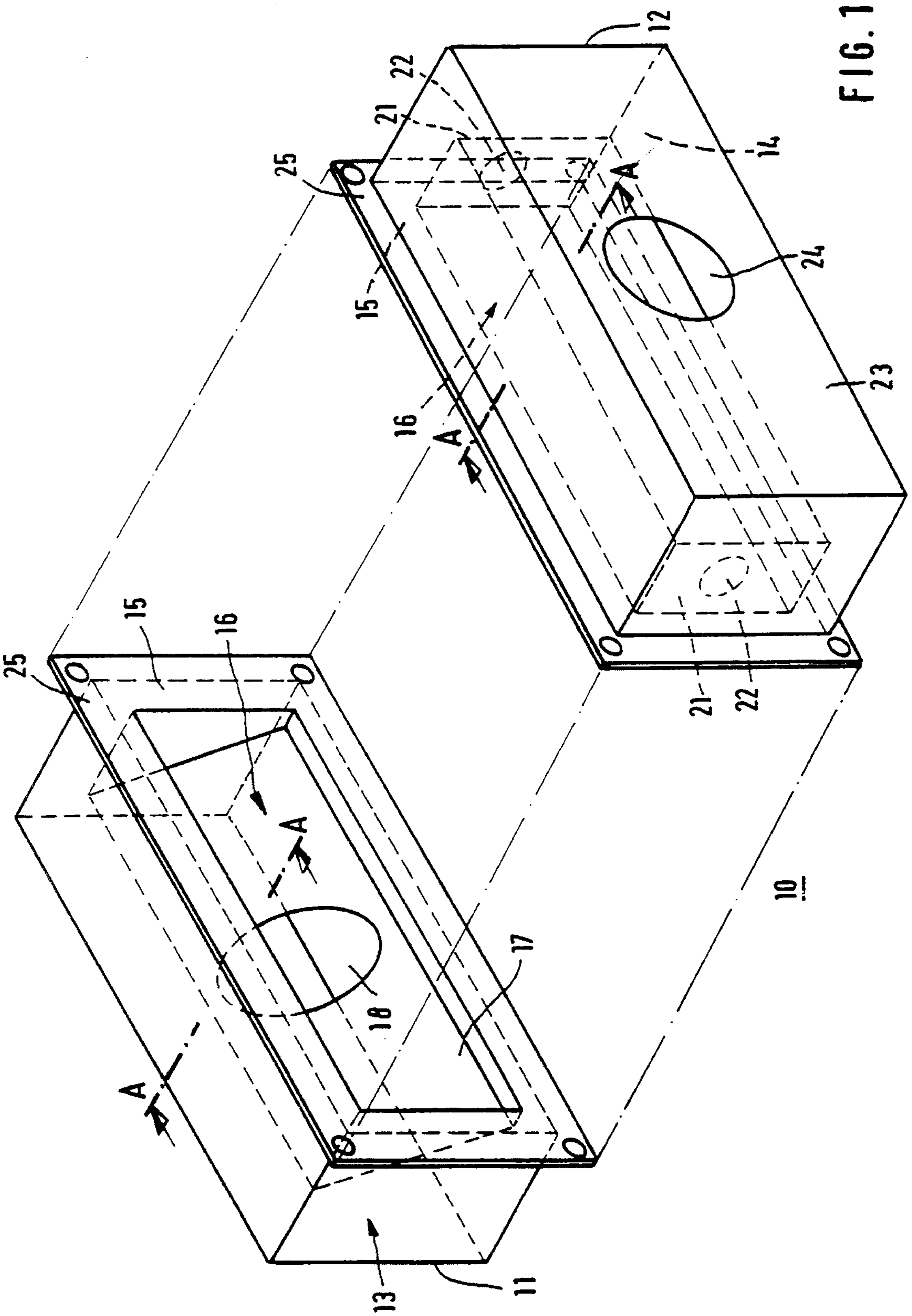
FIG. 1 is a perspective representation of a box.
Figure 2:
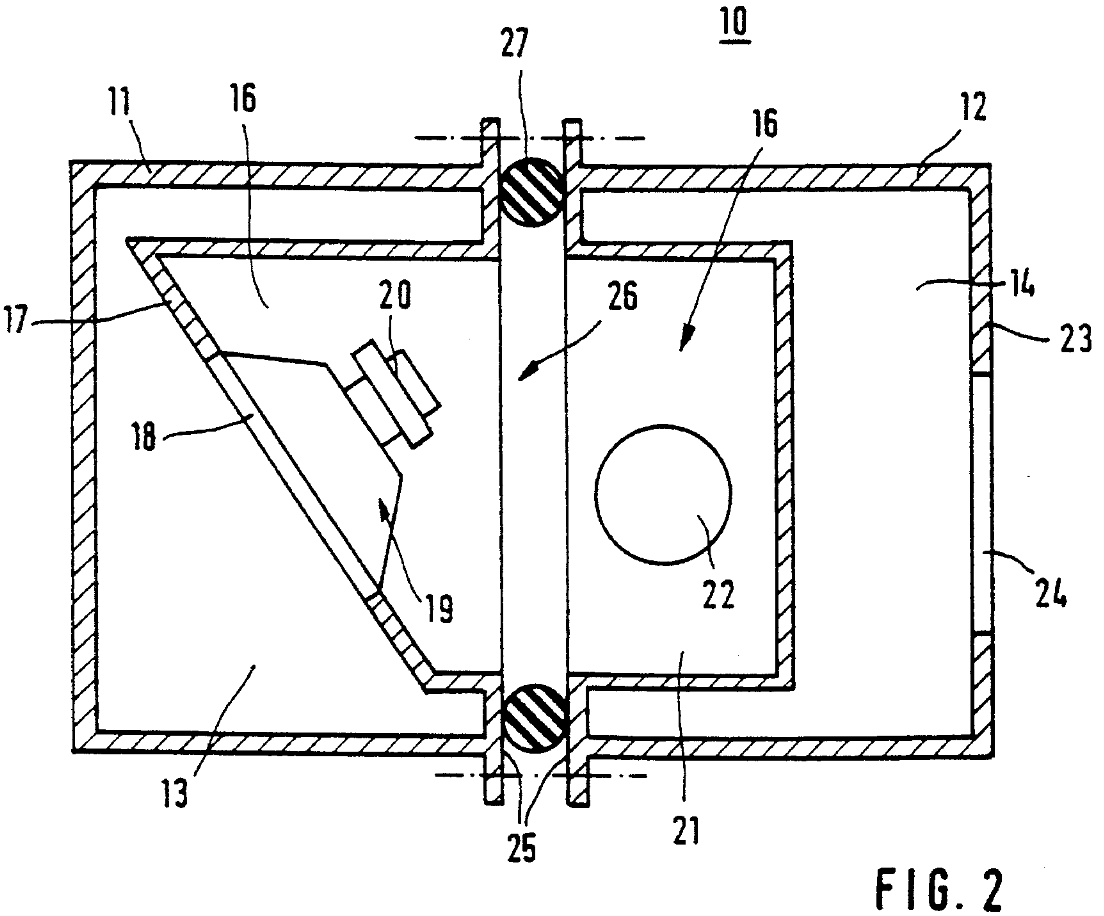
FIG. 2 depicts a section through a box according to FIG. 1.

FIG. 1 illustrates a perspective view of a double chamber box 10. This double chamber box 10 is formed of two hollow bodies 11, 12 produced by the blow-molding method. For better understanding, FIG. 1 shows the two hollow bodies 11, 12 in the unconnected condition. Each of these two hollow bodies 11, 12 encloses a space, where the space of hollow body 11 is called a closed space 13, and that of hollow body 12 a tuning space 14. The walls 15 of the two hollow bodies 11, 12 facing each other, contain cavities 16, which extend into the space 13, 14 of the respective hollow body 11, 12. The cross section of the opening of both cavities 16 is rectangular and has the same dimensions in both hollow bodies 11, 12. The cavity 16 of hollow body 12 is box-shaped. This also applies to most of cavity 16 of hollow body 11, but here the wall part 17, which separates the closed volume 13 from the cavity 16, is inclined at an angle. These relationships are further clarified in FIG. 2, which shows a cut A/A through a double chamber box 10 in the connected condition. The wall part 17 of hollow body 11 contains an opening 18, into which a loudspeaker 19 (not shown) can be inserted. In the configuration example of FIG. 1—as shown in more detail in FIG. 2—the loudspeaker 19 is inserted into the opening 18 in such a way, that its magnet system 20 extends into the cavity 16 of hollow body 11.

The cavity 16 of hollow body 12 is equipped with two openings 22 in the side parts 21 of the cavity 16. These openings 22 connect the open volume 26 (FIG. 2) with the tuning space 14, when the box is assembled. In addition, the outer wall 23 contains a sound outlet opening 24, which is centrally located in the outer wall 23. Since the hollow body 12 is furthermore symmetrical, both openings 22 are symmetrically located with respect to the sound outlet opening 24. The cross section area of the sound outlet opening 24 corresponds in size to the cross section area of both openings 22.

If both hollow bodies 11, 12—shown in FIG. 1—are connected by their perimetrical flange 25, the cavities 16 of both hollow bodies 11, 12 encompass a volume, which is called the open volume 26 of the double chamber box 10. The latter is shown in more detail in FIG. 2. A perimetrical seal ring 27 is located between the two flanges 25, to ensure the tightness of the connection of both hollow bodies 11, 12. In the present configuration example, the connection of both hollow bodies 11, 12 is made by a number of screws (indicated by broken lines in flanges 25). This has the advantage that the connection of both hollow bodies 11, 12 can be automated to a large extent. However, the connection is not limited to screws, since in another configuration example—not illustrated here—the connection of both hollow bodies 11, 12 can also be made with snaps or glue.

If a loudspeaker 19 produces low-frequency sound signals in the open volume 26, the sound waves are transferred through openings 22 into the tuning space 14 of hollow body 12, and from there pass to the environment through the outlet opening 24. The size of the tuning space 14, which is not drawn to scale in FIGS. 1 to 3, takes over the function of the usual bass reflex tube.

Figure 3:
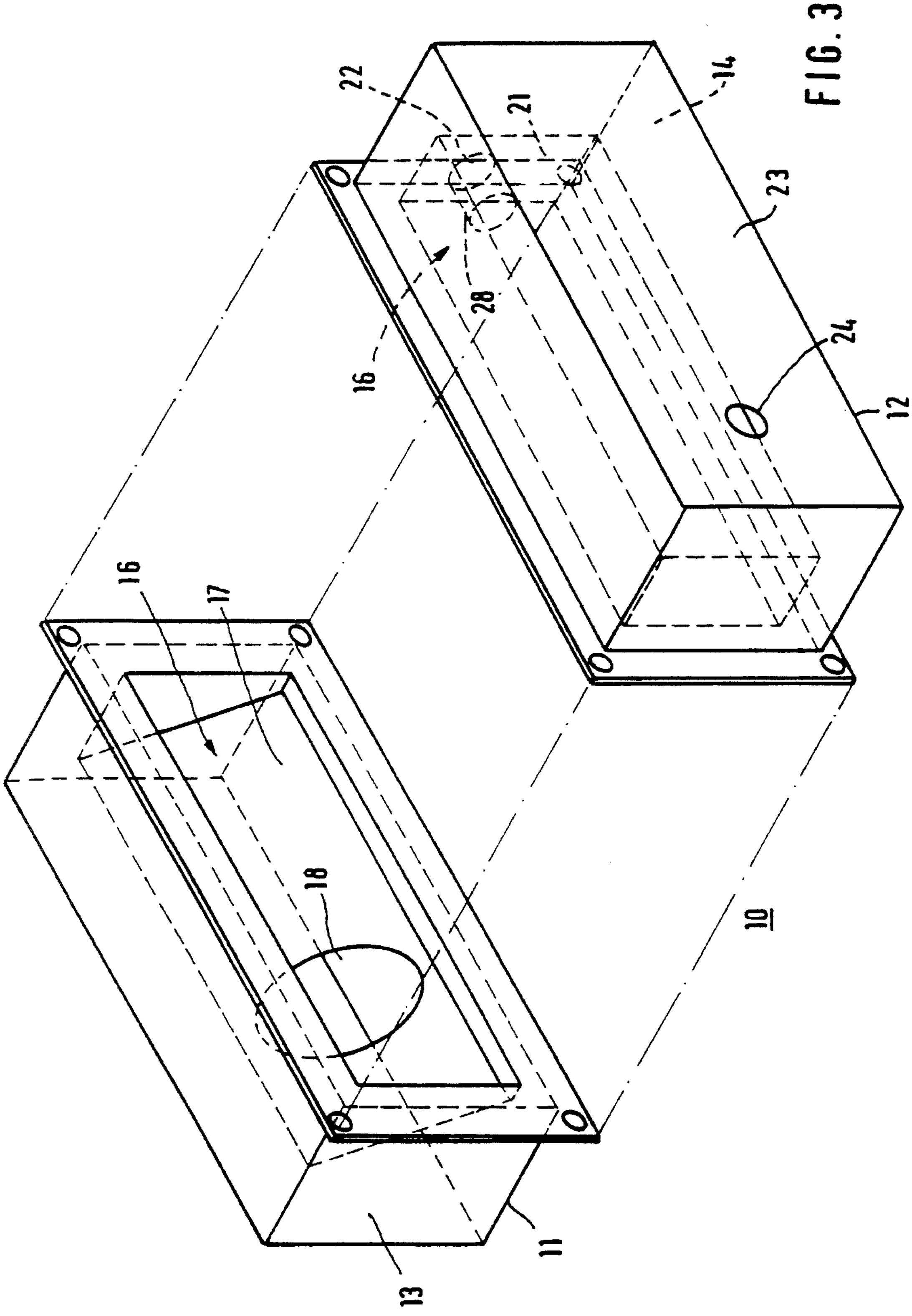
FIG. 3 is another representation of FIG. 1.

FIG. 3 shows an arrangement that is slightly modified with respect to FIG. 1. It differs from the configuration in FIG. 1 in that the opening 18 is not centrally located in the wall part 17 of hollow body 11. In addition, the cavity 16 of hollow body 12 has only one opening 22. This opening 22 is located in the side wall 21, which contains the longer of the two distances to opening 18. Nor is the outlet opening 24 centered in the outer wall 23, rather it is nearly opposite the opening 18 of hollow body 11, when both hollow bodies 11, 12 are joined into a double chamber box 10. Due to this geometry of box 10, the utilization of space is slightly worse than that of a box 10 according to FIG. 1. Furthermore, the opening 22 is equipped with a piece of tube 28, which protrudes into the cavity 16 of hollow body 12. The cross sectional areas of both openings 22, 24 have the same size.

In addition, it should be pointed out that the tube piece 28 according to FIG. 3 is only used to lower the tuning frequency of box 10. However, this does not mean that the use of such tube pieces 28 is necessary for the realization of the invention. Rather, the boxes 10 made according to the invention can be operated with very good reproduction results in a frequency range between 50 and 140 Hz, even without the tube pieces 28 shown in the opening or openings 22 of FIG. 3.

We claim:

1. A double chamber bass reflex box, having a partition wall that divides a double chamber box (10) into two spaces (13, 26), at least one loudspeaker (19), which is inserted into an opening (18) in the partition wall, and a tuning space (14), which connects an inside of an open space (26) with a listening (monitoring) space, characterized in that a closed space (13) of the double chamber box (10) is formed of a first blow-molded hollow body (11), the tuning space (14) of the double chamber box (10) is also formed of a second blow-molded hollow body (12), each first and second blow-mold hollow body (11, 12) has a respective wall (15) for containing a corresponding cavity (16) formed therein, and the open space (26) of the double chamber box (10) is formed by connecting the first blow-mold hollow body (11) and the second blow-mold hollow body (12), by joining each respective wall (15) containing each corresponding cavity (16).

2. A double chamber bass reflex box according to claim 1, characterized in that an exit opening (24), which connects the tuning space (14) with the listening space, is placed symmetrical to openings (22), which connect the open space (26) of the double chamber box (10) with the tuning space (14).

3. A double chamber bass reflex box according to claim 2, characterized in that the openings (22), which connect the open space (26) of the double chamber box (10) with the tuning space (14), are equipped with a tube connection (28).

4. A double chamber bass reflex box according to claim 1, characterized in that a seal (27) is placed between the blow-mold hollow bodies (11, 12) at respective touching surfaces (25, 25).

5. A double chamber bass reflex box according to claim 1, characterized in that the openings (22), which connect the open space (26) of the double chamber box (10) with the tuning space (14), are equipped with a tube connection (28).

* * * * *